(12) United States Patent
Yang et al.

(10) Patent No.: US 12,170,297 B2
(45) Date of Patent: *Dec. 17, 2024

(54) PIXEL CIRCUIT, CONTROL METHOD AND IMAGE SENSOR

(71) Applicant: SMARTSENS TECHNOLOGY (HK) CO., LIMITED, Hong Kong (CN)

(72) Inventors: Guang Yang, Shanghai (CN); Jinjian Hou, Shanghai (CN); Guanjing Ren, Shanghai (CN); Yaowu Mo, Shanghai (CN); Xiaoyong Wang, Shanghai (CN)

(73) Assignee: SMARTSENS TECHNOLOGY (HK) CO., LIMITED, Hong Kong (CN)

( * ) Notice: Subject to any disclaimer, the term of this patent is extended or adjusted under 35 U.S.C. 154(b) by 395 days.

This patent is subject to a terminal disclaimer.

(21) Appl. No.: 17/566,507

(22) Filed: Dec. 30, 2021

(65) Prior Publication Data

US 2023/0138982 A1 May 4, 2023

(30) Foreign Application Priority Data

Nov. 4, 2021 (CN) .......................... 202111301603.1

(51) Int. Cl.
 *H01L 27/146* (2006.01)
(52) U.S. Cl.
 CPC .. *H01L 27/14612* (2013.01); *H01L 27/14621* (2013.01); *H01L 27/14627* (2013.01)
(58) Field of Classification Search
 CPC ......... H01L 27/14612; H01L 27/14621; H01L 27/14627; H01L 27/14641; H04N 25/704; H04N 25/75; H04N 25/766; H04N 25/46; H04N 25/59; H04N 25/778
See application file for complete search history.

(56) References Cited

U.S. PATENT DOCUMENTS

| | | | | |
|---|---|---|---|---|
| 2011/0228147 A1* | 9/2011 | Matsuo | ................ | H04N 23/843 348/E5.091 |
| 2015/0312461 A1* | 10/2015 | Kim | .................. | H01L 27/14627 348/308 |
| 2015/0350583 A1* | 12/2015 | Mauritzson | ....... | H01L 27/14647 257/432 |
| 2021/0337144 A1* | 10/2021 | Wang | ................ | H01L 27/14621 |
| 2023/0199341 A1* | 6/2023 | Ui | ........................ | H04N 25/778 348/302 |

* cited by examiner

*Primary Examiner* — Thanh Luu
*Assistant Examiner* — Monica T Taba
(74) *Attorney, Agent, or Firm* — Cheng-Ju Chiang

(57) ABSTRACT

This application belongs to the technical field of semiconductor devices, and relates to a pixel circuit, a control method, and an image sensor, including: at least two pixel units arranged in an array, wherein transmission transistors of at least two pixels of at least one pixel unit are connected to a corresponding first group of transmission control lines, and a transmission transistor of one other pixel is connected to a corresponding second group of transmission control lines. Therefore, the pixel circuit, the control method and the image sensor provided in the present application can control the density of phase focus of the image sensor by controlling the first group of transmission control lines and the second group of transmission control lines without changing the structure of the pixel, the structure is simple, and the optical performance is good.

19 Claims, 7 Drawing Sheets

PIXEL CIRCUIT, CONTROL METHOD AND IMAGE SENSOR

CROSS-REFERENCE TO RELATED APPLICATION

The present application is based on and claims the priority of Chinese patent application No. 202111301603.1, filed on Nov. 4, 2021. The entire disclosure of the above-identified application is incorporated herein by reference.

TECHNICAL FIELD

The present application relates to the technical field of semiconductor devices, and particularly to a pixel circuit, a control method and an image sensor.

BACKGROUND

With the development of the technology of the image sensor, the application field of the image sensor is more and more extensive, for example, the image sensor can be applied to the fields of medical radiation imaging, industrial flaw detection, security inspection and the like.

Current image sensors are not adjustable in the density of phase focus, and therefore, the density of phase focus cannot be switched according to a specific scene.

For the above problems, a person skilled in the art has been seeking solutions.

The foregoing description is to provide general background information and does not necessarily constitute prior art.

SUMMARY

The technical problem to be solved by the present application is to provide a pixel circuit, a control method and an image sensor for the defects in the prior art, so as to ensure optical performance while achieving switching of the density of phase focus. This application is realized as follows:

The present application provides a pixel circuit, including: at least two pixel units, the at least two pixel units are arranged in an array.

Each pixel unit includes at least two pixels. Wherein each of the pixels comprises a photoelectric conversion element and a transmission transistor, and the photoelectric conversion element is used for generating an electric charge in response to incident light; the transmission transistor is coupled between the photoelectric conversion element and a floating diffusion node, and is configured to transfer the electric charge accumulated by the photoelectric conversion element in an exposure process to the floating diffusion node according to a transmission control signal. Wherein, the transmission transistor of at least one of the pixels of at least one of the pixel units is connected to a corresponding first group of transmission control lines, and the first group of transmission control lines includes at least one transmission control line, and one of the pixels corresponds to one of the transmission control lines; and the transmission transistors of other pixel unit are connected to a corresponding second group of transmission control lines.

Optionally, at least two of the pixels in the same pixel unit share a micro lens.

Optionally, the number of transmission control lines of the first group of transmission control lines is less than or equal to the number of pixels of corresponding ones of the pixel units.

Optionally, the number of the transmission control lines of the first group of transmission control lines is greater than the number of pixels of corresponding ones of the pixel units.

Optionally, each row of the pixel units is provided with the corresponding first group of transmission control lines and the corresponding second group of transmission control lines.

Optionally, when a density of phase focus is 100%, a timing of a transmission control signal received by the first group of transmission control lines is the same as a timing of the transmission control signal received by the second group of transmission control lines; and when the density of phase focus is not 100%, the timing of the transmission control signal received by the first group of transmission control lines is different from the timing of the transmission control signal received by the second group of transmission control lines.

Optionally, each pixel unit includes four pixels, and the four pixels in the same pixel unit share a micro lens, and the first group of transmission control lines corresponding to each row of pixel units includes four transmission control lines; wherein, the transmission transistors of the four pixels in the pixel unit connected to the first group of transmission control lines are respectively connected to the corresponding four transmission control lines in the first group of transmission control lines.

Optionally, the second group of transmission control lines comprises four transmission control lines, when the phase focus density is not 100%, a time when the first sub-transmission control line of the first group of transmission control lines receives an effective-level transmission control signal and the time when the second sub transmission control line of the first group of transmission control lines receives the effective-level transmission control signal are offset from each other to obtain left-right phase information and/or up-down phase information, and four transmission control lines of the second group of transmission control lines receive the effective-level transmission control signal to obtain image information; wherein, the first sub-transmission control line comprises two transmission control lines correspondingly connected to a first pair of pixels adjacent to each other in the four pixels, and the second sub-transmission control line comprises two transmission control lines correspondingly connected to a second pair of pixels other than the first pair of pixels in the four pixels.

Optionally, in the same row of pixel units, two of the pixel units connected to the first group of transmission control lines are separated by at least one pixel unit.

Optionally, the pixel units of a nth row of the pixel circuit are arranged in cycles corresponding to a first green color filter and a blue color filter, and the pixel units of a (n+1)th row are arranged in cycles corresponding to a red filter and a second green color filter; or, each pixel unit group comprises four pixel units arranged in an array, and the four pixel units of each pixel unit group respectively correspond to the first green color filter, the blue color filter, the second green color filter and the red color filter in a clockwise direction; wherein, the pixel unit connected to the first group of transmission control lines is correspondingly arranged at a position corresponding to the first green color filter.

Optionally, in the same row of pixel units, two pixel units connected to the first group of transmission control lines are separated by at least one pixel unit.

Optionally, the pixel circuit further includes:
a reset transistor, which is coupled between a first voltage source and the floating diffusion node; and/or, an amplification output unit, which is coupled to the floating diffusion node and is configured to output a voltage signal of the floating diffusion node; and/or, a dual-conversion gain control unit, which is coupled between the reset transistor and the floating diffusion node and is configured to implement gain control; and/or, a row selection transistor, which is coupled between an output terminal of the amplification output unit and a column output line, and a gate of the row select transistor receives a row selection control signal for outputting the voltage signal of the floating diffusion node.

The present application also provides an image sensor including the pixel circuit described above.

The present application also provides a control method of the above-mentioned pixel circuit, and the control method includes: acquiring image information based on the first group of transmission control lines and the second group of transmission control lines; or acquiring phase focus information based on the first group of transmission control lines and the second group of transmission control lines; or acquiring the phase focus information based on the first group of transmission control lines, and acquiring the image information based on the second group of transmission control lines.

Optionally, the control method comprises a single-row reading mode or a parallel reading mode, wherein: acquiring the phase focus information based on different pixels of a same pixel unit connected to the first group of transmission control lines in a reading process; or acquiring the phase focus information based on the pixel units of different pixel unit rows connected to the first group of transmission control lines in the reading process.

Optionally, the manner of acquiring the phase focus information based on different pixel unit rows includes: a pixel array has a first focus pixel row comprises at least one first pixel unit connected to the first group of transmission control lines, and a second focus pixel row comprises at least one second pixel unit connected to the first group of transmission control lines, wherein acquiring first focus information based on the first focus pixel row, and acquiring second focus information based on the second focusing pixel row, so as to obtain the phase focus information.

The present application provides a pixel circuit, a control method, and an image sensor, wherein a transmission transistor of at least two pixels of at least one pixel unit is connected to a corresponding first group of transmission control lines, and a transmission transistor of one other pixel is connected to a corresponding second group of transmission control lines. Therefore, the pixel circuit, the control method and the image sensor provided in the present application can control the density of phase focus of the image sensor by controlling the first group of transmission control lines and the second group of transmission control lines without changing the structure of the pixel, the structure is simple, and the optical performance is good.

To make the above and other objects, features, and advantages of the present disclosure more comprehensible, the following detailed description is set forth in detail below with reference to the accompanying drawings.

DETAILED DESCRIPTION OF PREFERRED EMBODIMENTS

Figure 1:
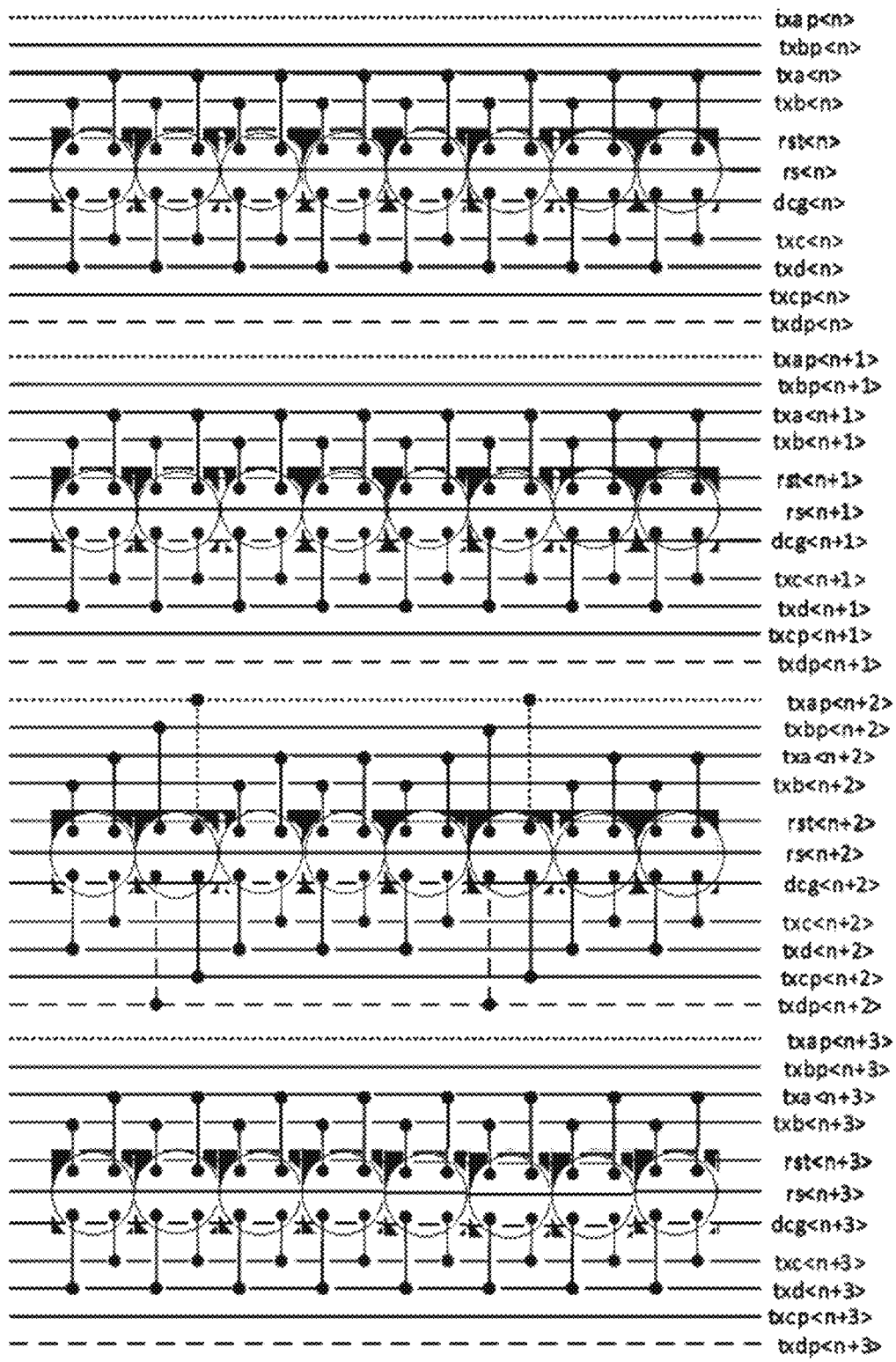
FIG. 1 is a structural diagram of a pixel circuit provided by an embodiment of this application.

Exemplary embodiments of the present application are described in detail with reference to the accompanying drawings, but the present application is not limited to the following embodiments.

The terms "first", "second", "third", "fourth", etc. in the description and claims of the present application are all used for distinguishing similar objects rather than describing a particular sequence or order.

The present application provides a pixel circuit, the pixel circuit includes at least two pixel units arranged in an array, and each pixel unit includes:

at least two pixels, each of the pixels includes a photoelectric conversion element and a transmission transistor, and the photoelectric conversion element is used for generating an electric charge in response to incident light, and the photoelectric conversion element includes but is not limited to a photodiode PD; the transmission transistor is coupled between the photoelectric conversion element and a floating diffusion node, and is configured to transfer the electric charge accumulated by the photoelectric conversion element in an exposure process to the floating diffusion node according to a transmission control signal;

a reset transistor, coupled between a first voltage source and the floating diffusion node, and configured to reset a voltage of the floating diffusion node according to a reset control signal;

an amplification output unit, coupled to the floating diffusion node, and configured to output a voltage signal of the floating diffusion node;

wherein, the transmission transistor of at least one of the pixels of at least one of the pixel units is connected to a corresponding first group of transmission control lines to obtain focus information required for phase focusing. In one embodiment, the transfer transistors of at least two pixels of at least one pixel unit are connected to the corresponding first group of transmission control lines. Wherein, the first group of transmission control lines includes at least one transmission control line, one of the pixels corresponds to one of the transmission control lines; the transmission transistor in one other pixel unit is connected to a corresponding second group of transmission control lines, and the first group of transmission control lines is different from the second group of transmission control lines.

According to an embodiment of the present application, the amplification output unit includes a source follower transistor, a gate of the source follower transistor is coupled to the floating diffusion node, a drain thereof is coupled to a second voltage source, and a source thereof is coupled to the row selection transistor as an output terminal.

Wherein, the first voltage source and the second voltage source may be the same voltage source, so that the reset transistor and the source follower transistor are simultaneously connected to the same voltage source, of course, the first voltage source and the second voltage source may also be a different voltage sources, and the reset transistor and the source follower transistor are respectively connected.

In an embodiment, the pixel circuit further includes a dual-conversion gain control unit, which is coupled between the reset transistor and the floating diffusion node, and is configured to implement gain control.

As a specific embodiment, the dual-conversion gain control unit comprises a dual-conversion gain control transistor and a dual-conversion gain capacitor, the dual-conversion gain control transistor is coupled between the reset transistor and the floating diffusion node, the first terminal of the dual-conversion gain capacitor is coupled between the double-conversion gain transistor and the reset transistor, and the second terminal of the dual-conversion gain capacitor is connected to the specified level or the ground.

In an embodiment, the pixel circuit further includes a row selection transistor coupled between an output terminal of the amplifying output unit and a column output line, and a gate of the row selection transistor receives a row selection control signal for outputting the voltage signal of the floating diffusion node.

In an embodiment, at least two pixels in the same pixel unit share a micro lens. For example, it may be that four pixels share one micro lens, and in a further embodiment, one pixel unit may include four pixels, and the four pixels in the same pixel unit share the same micro lens. In other embodiments, one pixel unit may also include two pixels, and the two pixels in the same pixel unit share the same micro lens. In an embodiment, all the pixels in the same pixel unit share one micro lens.

In an embodiment, the number of transmission control lines in the first group of transmission control lines corresponding to each row of pixel units is equal to the number of pixels in each pixel unit, and the pixels are in one-to-one correspondence with the transmission control lines. Of course, in other embodiments, the number of the transmission control lines in the first group of transmission control lines may also be smaller than the number of pixels in each corresponding pixel unit, for example, the pixel unit includes four pixels, wherein the two pixels are connected to the first group of transmission control lines, and the other two are connected to the second group of transmission control lines.

In an embodiment, when a density of phase focus is 100%, a timing of a transmission control signal received by the first group of transmission control lines is the same as a timing of the transmission control signal received by the second group of transmission control lines; and when the density of phase focus is not 100%, the timing of the transmission control signal received by the first group of transmission control lines is different from the timing of the transmission control signal received by the second group of transmission control lines.

In an embodiment, each pixel unit includes four pixels, and the four pixels in the same pixel unit share one micro lens, and the first group of transmission control lines corresponding to each row of pixel units includes four transmission control lines; wherein the transmission transistors of the four pixels in the at least one pixel unit are respectively connected to four transmission control lines in the corresponding first group of transmission control lines.

In an embodiment, when the phase focus density is not 100%, a time when the first sub-transmission control line of the first group of transmission control lines receives an effective-level transmission control signal and a time when the second sub transmission control line of the first group of transmission control lines receives the effective-level transmission control signal are offset from each other to obtain left-right phase information and/or up-down phase information, and four transmission control lines of the second group of transmission control lines receive the effective-level transmission control signal to obtain image information. Wherein, the first sub-transmission control line includes two transmission control lines correspondingly connected to a first pair of pixels adjacent to each other in the four pixels, and the second sub-transmission control line includes two transmission control lines correspondingly connected to a second pair of pixels other than the first pair of pixels in the four pixels.

The pixel circuit provided by the present application includes at least two pixel units, and all pixels in each pixel unit share a reset transistor, an amplification output unit, and a row selection transistor, thereby saving chip area and facilitating device miniaturization. And a transmission transistor of at least two pixels of at least one pixel unit is connected to a corresponding first group of transmission control lines, and a transmission transistor of one other pixel is connected to a corresponding second group of transmission control lines, so that the density of phase focus of the image sensor can be controlled by controlling the first group of transmission control lines and the second group of transmission control lines without changing the structure of the pixel, the structure is simple, and the optical performance is good. In addition, at least two pixels in the same pixel unit share one micro lens, so that mutual influence between pixels can be avoided, and the number of transmission control lines in the first group of transmission control lines corresponding to each row of pixel units can be set equal to the number of pixels in each pixel unit, so that the left-right phase information and/or the up-down phase information can be obtained while different densities of phase focus can be switched, and the flexibility can be further improved.

The solution of the present application is described in detail below with reference to several specific embodiments.

The First Embodiment

Figure 2:
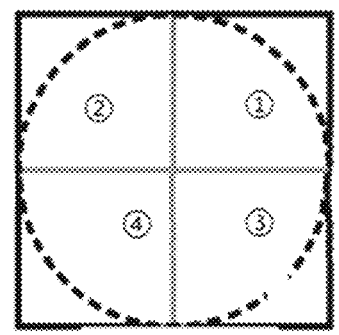
FIG. 2 is a structural diagram of a pixel unit in a pixel circuit provided by an embodiment of this application.
Figure 3:
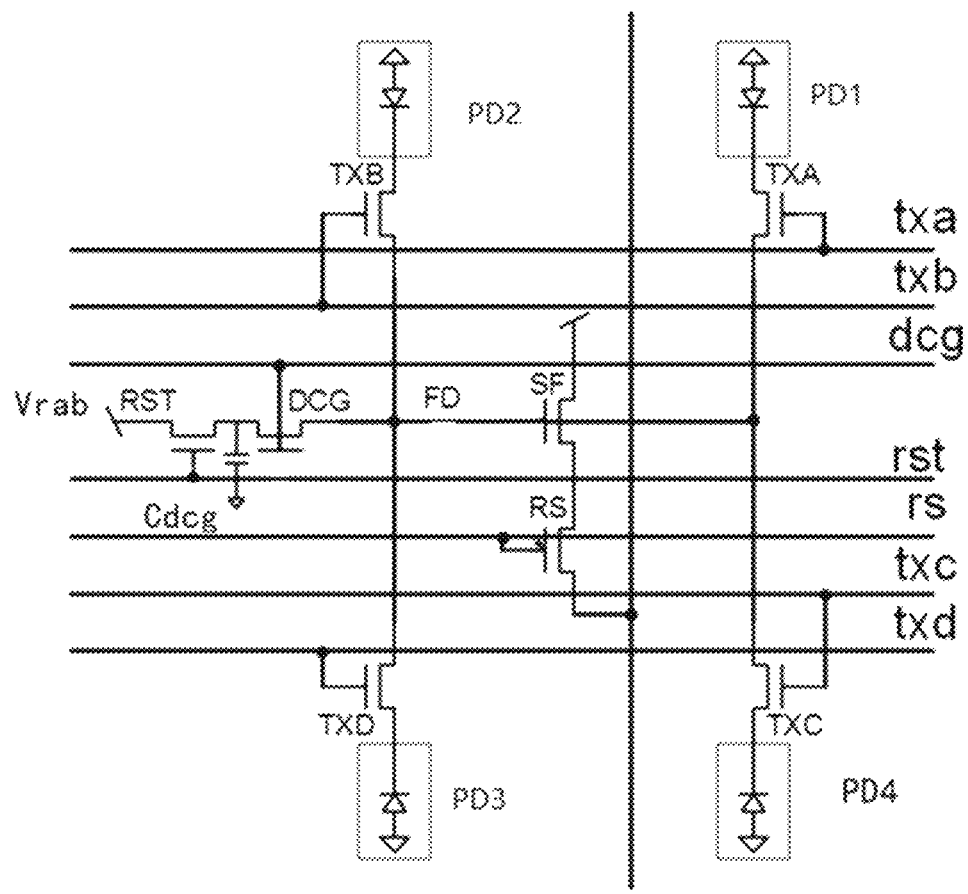
FIG. 3 is a circuit diagram of a pixel unit in a pixel circuit provided by an embodiment of this application.

Referring to FIG. 1, FIG. 2 and FIG. 3, as shown in FIG. 1, a pixel circuit according to an embodiment of this application includes N pixel units (FIG. 1 shows 8×4 pixel units, but the present application is not limited thereto), N pixel units are arranged in an array, where N is a positive integer, and N≥2.

As shown in FIG. 2, in an embodiment, each pixel unit includes 4 pixels ①, ②, ③, and ④, but the present application is not limited thereto. In one embodiment, the four pixels (①, ②, ③, and ④) correspond to one micro lens, And in other embodiments, two pixels may also share one micro lens or the like.

Wherein, the transmission transistors of at least two pixels of at least one of the pixel units are connected to a corresponding first group of transmission control lines, and the transmission transistors of other pixels are connected to a corresponding second group of transmission control lines; wherein, the first group of transmission control lines includes at least one transmission control line, and one said pixel corresponds to one said transmission control line. It can be that one pixel is connected to only one transmission control line, and one transmission control line can be connected correspondingly to pixels in different pixel units.

In one embodiment, each row of the pixel units is provided with the corresponding first group of transmission control lines and the corresponding second group of transmission control lines. In an optional example, for the pixel units connected to the first group of transmission control lines, some pixels are connected to the first group of transmission control lines, and the remaining pixels are connected to the second group of transmission control lines.

In this embodiment, each pixel unit includes four pixels, and each row of pixel units corresponds to eight transmission control lines. Taking an n-th row of pixel units as an example, it corresponds to four transmission control lines txap <n>, txbp <n>, txcp <n>, txdp <n> (constituting the first group of transmission control lines), corresponding four transmission control lines txa <n>, txb <n>, txc <n>, and txd <n> (constituting the second group of transmission control lines).

The first pixel ① of all pixel units in the nth row is connected to the first transmission control line txa<n> in the second group of transmission control lines, and the second pixel ② is connected to the second transmission control line txb<n> in the second group of transmission control lines, the third pixel ③ is connected to the third transmission control line txc<n> in the second group of transmission lines, and the fourth pixel ④ is connected to the fourth transmission control line txd<n> in the second group of transmission lines.

As shown in FIG. 1, in this embodiment, the transmission transistors of the four pixels of the pixel units of the second column and the sixth column in the (n+2)th row are connected to the first group of transmission control lines txap, txbp, txcp and txdp respectively, and the transmission transistors of the remaining pixel units are all connected to the second group of transmission control lines txa, txb, txc and txd, and in other embodiments, the number and the positions of the pixel units connected to the first group of transmission control lines may be adjusted according to needs, and the present application is not limited thereto.

In one embodiment, the number of the transmission control lines in the first group of transmission control lines is less than or equal to the number of pixels in the corresponding pixel unit. In other embodiments, the number of the transmission control lines in the first group of transmission control lines is greater than the number of pixels in the corresponding pixel units, and at this time, it can be that the number of transmission control lines is greater than the number of pixels of the pixel unit in the same row of pixel units, and at this time, the pixels of the pixel unit can be connected to the corresponding transmission control lines according to the actual design.

As an example, for a pixel unit connected to a first group of transmission control lines in the same row, the first group of transmission control lines may be divided into a plurality of parts, wherein among different parts, the control lines may be completely different, and may also have an overlap between the two parts; one pixel unit selects one of several parts to connect.

For example, four pixels of the first pixel unit are connected to four of the six transmission control lines, and two of the four pixels in the other second pixel unit in the same pixel unit row are connected to the remaining two control lines. And it is also possible that the four pixels in another second pixel unit are connected to the remaining two control lines, and two of the four control lines connected to the first pixel unit are selected to be connected to the pixels. Based on the above manner, a flexible design for relative focus pixels can be realized.

Each pixel includes a photoelectric conversion element and a transmission transistor, as shown in FIG. 3, four pixels in each pixel unit include photoelectric conversion elements PD 1, PD 2, PD 3, PD 4, transmission transistors TXA, TXB, TXC, TXD. Wherein, the photoelectric conversion elements PD1, PD2, PD3, and PD4 are used for generating an electric charge in response to incident light. And the transmission transistors TXA, TXB, TXC and TXD are coupled between the corresponding photoelectric conversion elements PD 1, PD 2, PD 3, PD 4 and floating diffusion node FD for transferring the electric charge accumulated in an exposure process to the floating diffusion node FD according to the transmission control signals TXA, TXB, TXC, TCD or TXAP, TXBP, TXCP, TXDP, respectively. Wherein, four pixels in a pixel unit may share a floating diffusion node FD, or two adjacent pixels may share a floating diffusion node, and the formed nodes FD1 and FD2 are electrically connected to the gate of the source follower transistor SF at the same time, and based on the output circuit, the signals corresponding to the two nodes FD1 and FD2 are simultaneously output. Specifically, the anode terminals of the photoelectric conversion elements PD1, PD2, PD3, and PD4 are connected to the ground terminal, and the cathode terminals thereof are coupled to the floating diffusion node FD through corresponding transfer transistors TXA, TXB, TXC, and TXD.

The reset transistor RST is coupled between the first voltage source Vrab and the floating diffusion node FD, and is configured to reset the voltage of the floating diffusion node FD according to the reset control signal rst.

The amplification output unit is coupled to the floating diffusion node FD, and is configured to amplify the voltage signal of the floating diffusion node FD. Specifically, in this embodiment, the amplification output unit includes a first source follower transistor SF, a gate of the first source follower transistor SF is coupled to the floating diffusion node FD, a drain thereof is coupled to the second voltage source VRSF, and a source thereof is coupled to the row select transistor as an output terminal. Of course, the present embodiment only schematically shows one implementation of the amplification output unit, and it should be appreciated by those skilled in the art that the amplification output unit may also use other different gain amplifiers to replace the source follower transistor SF, for example, two stages or multiple stages of amplifiers may be used to replace the source follower transistor SF in the present embodiment, and these variations are also within the protection scope of the present application.

In an embodiment, the pixel circuit further includes a dual-conversion gain control unit, which is coupled between the reset transistor RST and the floating diffusion node FD, and is used to implement gain control. As a specific embodiment, the dual-conversion gain control unit includes a dual-conversion gain control transistor DCG and a dual-conversion gain capacitor Cdcg, and the dual-conversion gain control transistor DCG is coupled between the reset transistor RST and the floating diffusion node FD. A first terminal of the dual conversion gain capacitor CDCG is coupled to the node between the dual conversion gain transistor DCG and the reset transistor RST, and A second terminal of the dual conversion gain capacitor Cdcg is connected to the specified level.

Wherein, as a preferred embodiment, the pixel circuit provided in this embodiment further includes a row select transistor RS coupled between the output terminal of the amplification output unit (eg. the source of the first source follower transistor SF) and the column output line, and a gate of the row select transistor RS being configured to receive a control signal rs for outputting a voltage signal of the floating diffusion node FD in a rolling exposure mode. Of course, it should be noted that the row select transistor RS is present as a preferred embodiment, and the implementation of the present application does not necessarily need to set the row select transistor RS.

Figure 4:
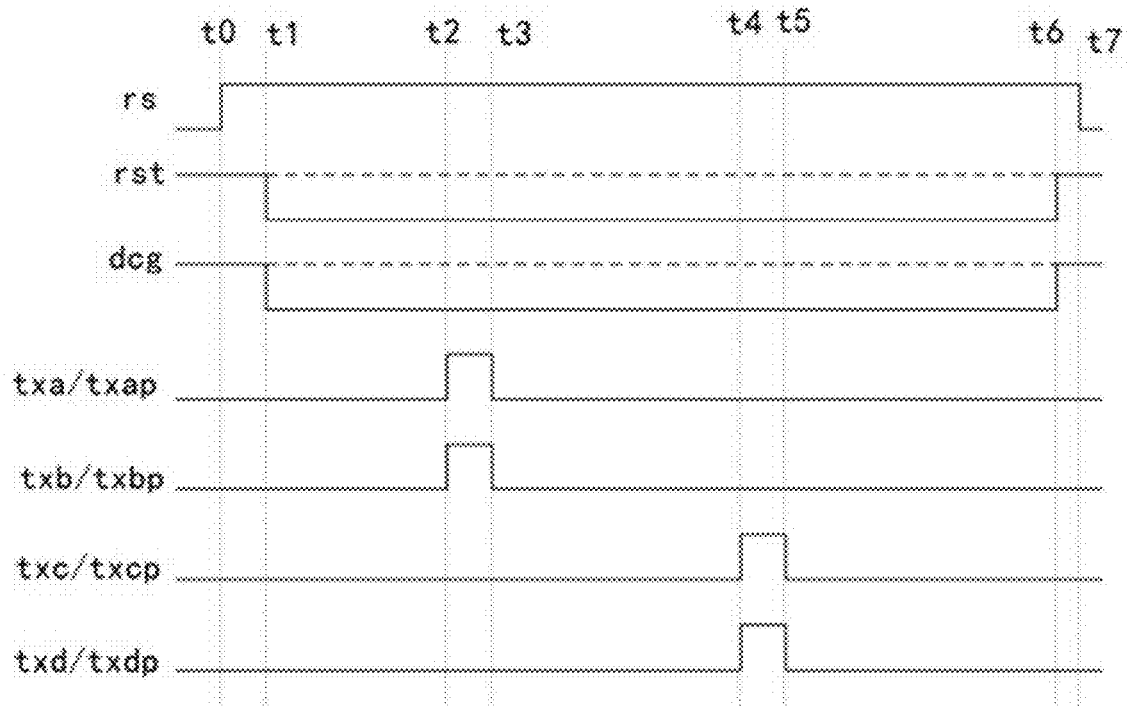
FIG. 4 is a timing diagram of a pixel unit in a pixel circuit provided by an embodiment of this application.

Taking the reset transistor RST, the transmission transistor TX, the first source follower transistor SF, the row select transistor RS, and the dual conversion gain control transistor DCG are all NMOS, N=8×4, the transfer transistors of the four pixels ①②③④ of the pixel unit of the second and sixth columns in the (n+2) row are respectively connected to the first transmission control line txap, the second transmission control line txbp, the third transmission control line txcp, and the fourth transmission control line txdp of the first group of transmission control lines, and the transfer transistors of the remaining pixel units in the (n+2)th row are all connected to the first transmission control line txa, the second transmission control line txb, the third transmission control line txc, and the fourth transmission control line txd of the second group of transmission control lines. the control timing thereof is as shown in FIG. 4 as an example to illustrate the working principle of the image sensor of the present embodiment, and a specific working process thereof is as follows:

1. At time t0, the row selection signal rs is set to a high level, and the quantization circuit is ready to quantize the data of the corresponding row;
2. At time t1, the reset signal rst and the dual-conversion gain selection signal dcg are set to a low level to obtain the corresponding image reset signal; of course, in other embodiments, the dual-conversion gain selection signal dcg can also be set to the high level;
3. At time t2, the first transmission control lines txap and txa in the first group of transmission control lines and the second group of transmission control lines, and the second transmission control lines txbp and txb in the first group of transmission control lines and the second group of transmission control lines, are both set to the high level. And the transfer transistors TXA and TXB of the first pixel ① and the second pixel ② of all the pixel units in the (n+2)th row are turned on, and all the pixel units in the (n+2)th row start to transmit the up phase information;
4. At time t3, the first transmission control lines txap and txa in the first group of transmission control lines and the second group of transmission control lines, and the second transmission control lines txbp and txb in the first group of transmission control lines and the second group of transmission control lines, are both set to the low level. And all the pixel units of the (n+2)th row finish transmitting the up phase information, and the quantized up phase information VTPD can be obtained through quantization by the quantization circuit;
5. At time t4, the third transmission control lines txcp and txc in the first group of transmission control lines and the second group of transmission control lines, and the fourth transmission control lines txdp and txd in the first group of transmission control lines and the second group of transmission control lines, are both set to the high level. And the transmission transistors TXC and TXD of the third pixel ③ and the fourth pixel ④ of all the pixel units in the (n+2)th row are all turned on, and all the pixel units in the (n+2)th row start to transmit the down phase information;
6. At time t5, the third transmission control lines txcp and txc in the first group of transmission control lines and the second group of transmission control lines, and the fourth transmission control lines txdp and txd in the first group of transmission control lines and the second group of transmission control lines, are both set to the low level. And all the pixel units of the (n+2)th row finish transmitting the down phase information, and if the two kinds of phase information are summed at the floating diffusion node fd, the image information Vsum is obtained by quantization again through the quantization circuit;
7. At time t6, the reset signal rst and the dual-conversion gain selection signal dcg are set to the high level to reset the floating diffusion node fd;
8. At time t7, the row selection signal rs is set to the low level to end the quantization of the current row.

After digital calculation, the down phase information VLPD (VLPD=Vsum−VTPD) can be obtained, so the (n+2)th row of pixel units of the image sensor of this embodiment can realize the up-down phase focus mode.

In other embodiments, the reset operation of setting the reset signal rst and the dual-conversion gain selection signal deg to the high level and then the low level can also be added between the time t3 and the time t4, so that the object quantized again by the quantization circuit is the individual down phase information instead of the summed Vsum. In addition, it should be noted that, based on the above-mentioned control principle, other focus data for phase focus can also be obtained based on the txap, the txbp, the txcp, and the txdp; and the corresponding relationship between the txap, the txbp, the txcp, the txdp and the txa, the txb, the txc, and the ted in timing can be designed according to actual requirements.

Figure 5:
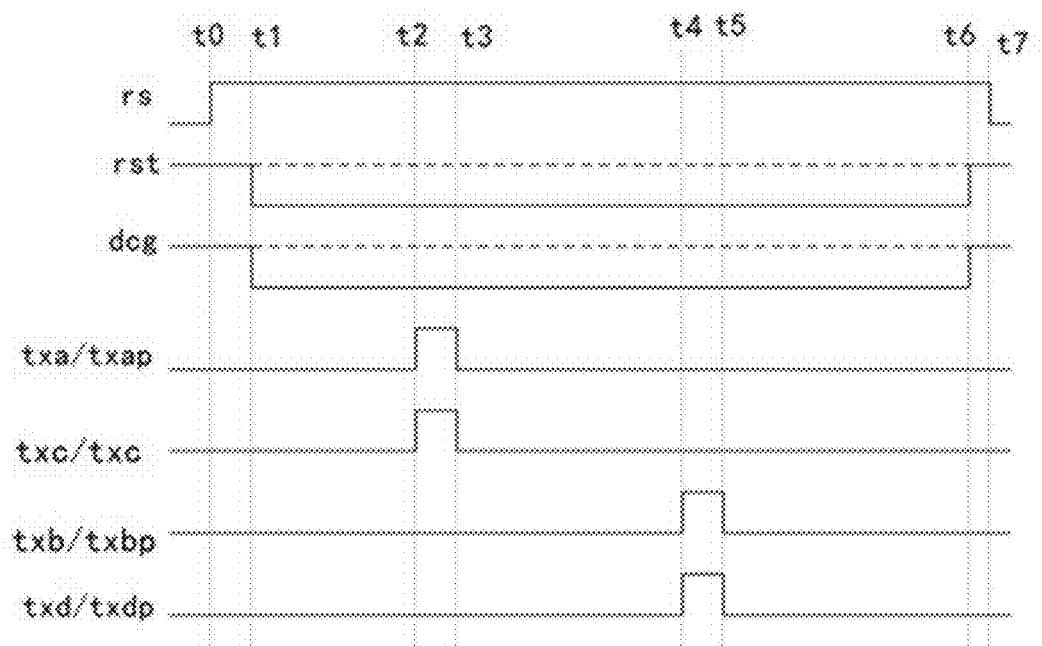
FIG. 5 is a timing diagram of another pixel unit in a pixel circuit provided by an embodiment of this application.

FIG. 5 is a timing diagram of another pixel unit in a pixel circuit provided by an embodiment of this application. Referring to FIG. 5, FIG. 2 and FIG. 3, the first transmission control line txap, txa of the first group of transmission control lines and the second group of transmission control lines corresponding to a certain pixel unit and the third transmission control line txcp and txc of the first group of transmission control lines and the second group of transmission control lines in the second group of transmission control lines are all set to the high level at the time t2, so that the transmission transistors TXA and TXC in the first pixel ① and the third pixel ③ of the pixel unit are turned on, so that the pixel unit starts to transmit the right phase information. And at the time t3, the first transmission control line txap, txa of the first group of transmission control lines and the second group of transmission control lines corresponding to the pixel unit and the third transmission control line txcp and txc of the first group of transmission control lines and the second group of transmission control lines corresponding to the pixel unit are both set to the low level, and the pixel unit ends transmitting the right phase information, and the quantized right phase information may be obtained by quantizing the circuit quantization. And the principle of obtaining the quantized left phase information is similar to the principle of obtaining the right phase information, and will not be repeated here.

Figure 6:
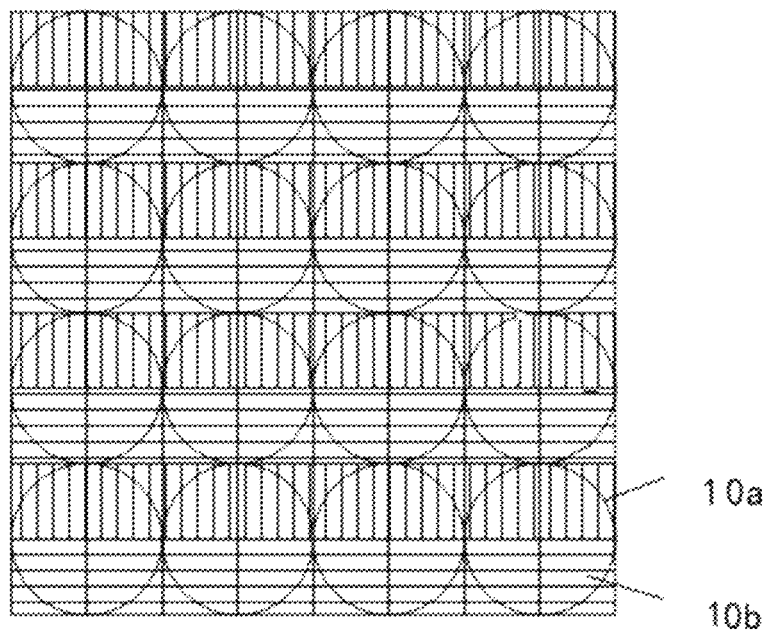
FIG. 6 is an effect diagram of the phase focus mode when an image sensor according to an embodiment of this application realizes that a density of up-down phase information is 100%.

FIG. 6 is an effect diagram of the phase focus mode when an image sensor according to an embodiment of this application realizes that a density of up-down phase information is 100%. If each of the pixel units in the pixel array performs quantization to obtain the up phase information 10a and the down phase information 10b under the control of the timing sequence shown in FIG. 4, the phase focus mode with the density of 100% of the up-down phase information can be realized. FIG. 6 only shows a 4×4 array, but the application is not limited to this. wherein, the up phase information 10a and the down phase information 10b are used for phase focus. In an embodiment, the effect shown in FIG. 6 can be realized based on the readout timing shown in FIG. 4.

Figure 7:
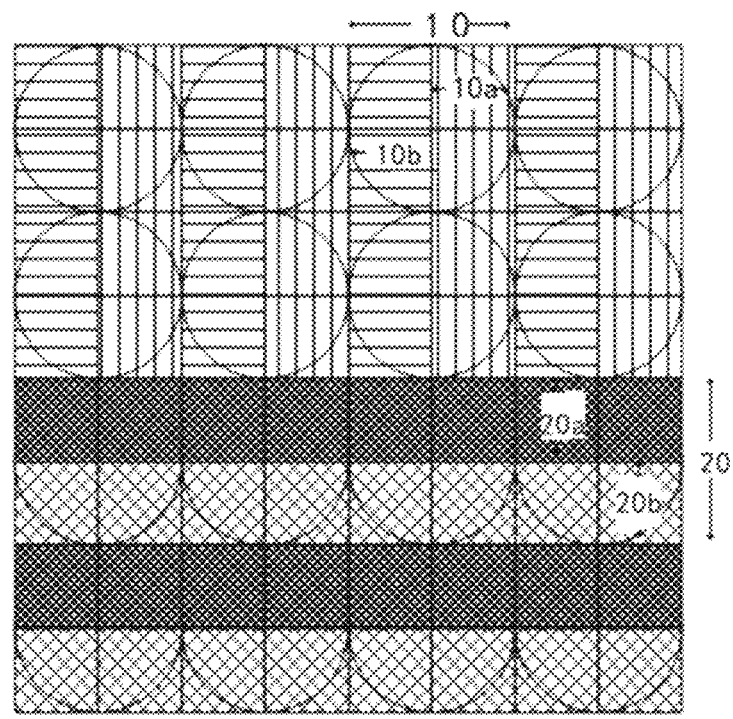
FIG. 7 is an effect diagram of the phase focus mode when an image sensor according to an embodiment of this application realizes that a density of up-down and left-right phase information is 100%.

FIG. 7 is an effect diagram of the phase focus mode when an image sensor according to an embodiment of this application realizes that a density of up-down and left-right phase information is 100%. The 4×2 pixel array in the 4×4 pixel array performs quantization to obtain the corresponding image information 10, the right phase information 10a and the left phase information 10b under the control of the timing shown in FIG. 4. And the other 4×2 pixel array in the 4×4 pixel array performs quantization to obtain the corresponding image information 20, the right phase information 20a and the left phase information 20b under the control of the timing shown in FIG. 6, wherein the image information is used for imaging, the left and right phase information, and the up and down phase information are used for phase focus. As shown in FIG. 7, in an embodiment, in the phase focus mode with a density of 100%, the pixel units used for acquiring left and right phase information and up and down phase information in the image sensor are 50% respectively. In other embodiments, the proportions and positions of the pixel units respectively used to obtain the left and right phase information and the upper and lower phase information in the entire pixel array can be configured according to phase focus requirements. In an embodiment, the effect shown in FIG. 7 can be realized based on the combination of the readout timing in FIG. 4 and FIG. 5.

Figure 8A:
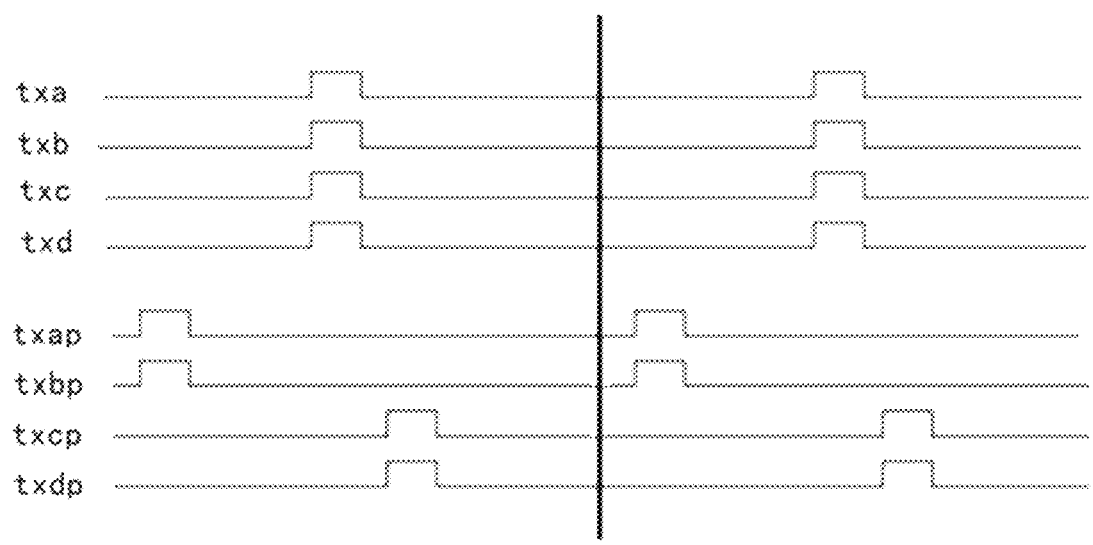
FIG. 8a is a timing diagram when an image sensor according to a first embodiment of this application realizes that a density of up-down phase information is 6%.

FIG. 8a is a timing diagram when an image sensor according to a first embodiment of this application realizes that a density of up-down phase information is 6%. Referring to FIG. 1 and FIG. 8a, as shown in FIG. 1, in the 4×8 pixel array, the transfer transistors of the four pixels of the pixel unit of the second and sixth columns of the (n+2) row are respectively connected to the first group of transmission control lines txap, txbp, txcp, and txdp, and the transmission transistors of the remaining pixel units are all connected to the second group of transmission control lines txa, txb, txc, and txd.

Therefore, under the control of the timing signal shown in FIG. 8a, the two pixel units in the second column and the sixth column in the (n+2) row are used to obtain the up and down phase information, and the remaining pixel units are used to obtain normal image information, for its specific implementation principle, please refer to the above description, which will not be repeated here. Therefore, under the control of the timing signal as shown in FIG. 8a, the present application can achieve a density of 2/4×8, which is approximately equal to a 6% phase focus mode.

In other embodiments, the timings of the first transmission control line txap and the third transmission control line txcp in the first group of transmission control lines txap, txbp, txcp, and txdp may be set to be the same, and the timing of the second transmission control line txbp and the fourth transmission control line txdp are set to be the same, so as to achieve a phase focus mode in which the density of the left and right phase information is 6%.

Figure 8B:
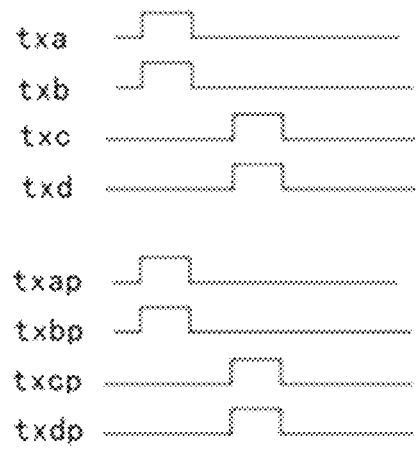
FIG. 8b is a timing diagram when an image sensor according to a second embodiment of this application realizes that a density of up-down phase information is 6%.

FIG. 8b is a timing diagram when an image sensor according to a second embodiment of this application realizes that a density of up-down phase information is 6%. Referring to FIG. 1 and FIG. 8a, as shown in FIG. 1, in the 4×8 pixel array, the transfer transistors of the four pixels of the pixel unit of the second and sixth columns of the (n+2) row are respectively connected to the first group of transmission control lines txap, txbp, txcp, and txdp, and the transmission transistors of the remaining pixel units are all connected to the second group of transmission control lines txa, txb, txc, and txd.

Therefore, under the control of the timing signal shown in FIG. 8b, the two pixel units in the second column and the sixth column in the (n+2) row are used to obtain the up and down phase information, and although the remaining pixel units can also be used to obtain up and down phase information under the control of the timing signal as shown in FIG. 8b, the readout circuit (not shown in the figure) may not use the remaining pixel units for phase focus. Therefore, under the control of the timing signal as shown in FIG. 8b, the present application can also achieve a density of 2/4×8, which is approximately equal to a 6% phase focus mode.

Figure 8C:
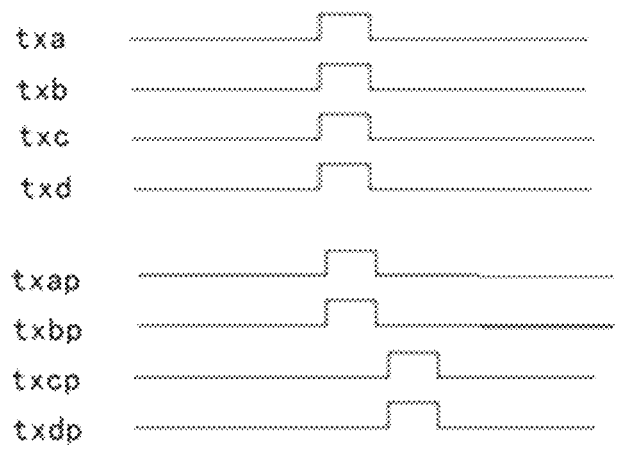
FIG. 8c is a timing diagram when an image sensor according to a third embodiment of this application realizes that a density of up-down phase information is 6%.

FIG. 8c is a timing diagram when an image sensor according to a third embodiment of this application realizes that a density of up-down phase information is 6%. The timing signals shown in FIG. 8c and FIG. 8a are basically the same, the only difference is that the time when the first group of transmission control lines txap, txbp and the second group of transmission control lines txa, txb, txc, and txd are at a high level is coincident. Under the control of the timing signal shown in FIG. 8c, the present application can also achieve a density of 2/4×8, that is, approximately equal to 6% of the phase focus mode, and the specific principles thereof refer to the description corresponding to FIG. 8a, and details are not described herein again.

It should be noted that, through the readout method of 8a to 8c, other arbitrary proportions of phase focusing can also be achieved. For example, 3% phase focusing can be achieved based on the design of the first set of transmission control lines and corresponding pixel units.

Figure 9:
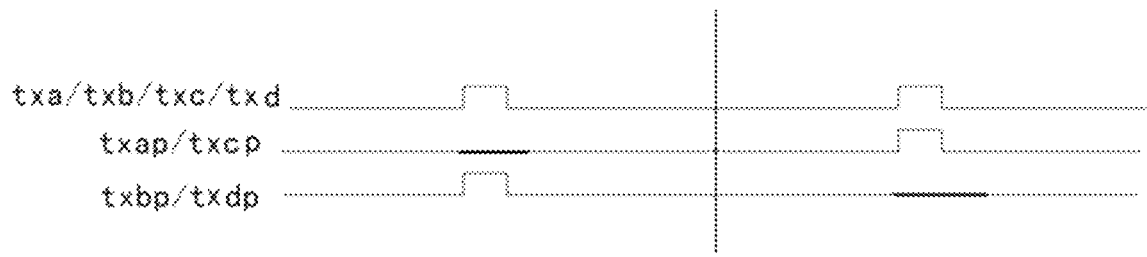
FIG. 9 is a timing diagram when an image sensor according to an embodiment of this application realizes that a density of left-right phase information is 6%.

FIG. 9 is a timing diagram when an image sensor according to an embodiment of this application realizes that a density of left-right phase information is 6%. Referring to FIG. 1 and FIG. 9, as shown in FIG. 1, in the 4×8 pixel array, the transfer transistors of the four pixels of the pixel unit of the second and sixth columns of the (n+2) row are respectively connected to the first group of transmission control lines txap, txbp, txcp, and txdp, and the transmission transistors of the remaining pixel units are all connected to the second group of transmission control lines txa, txb, txc, and txd.

Therefore, under the control of the timing signal as shown in FIG. 9, the two pixel units in the second column and the sixth column in the (n+2)th row are equivalent to acquiring left and right phase information at different times. In addition, the remaining pixel units are used to obtain normal image information. For example, the left side of the vertical dividing line in FIG. 9 represents reading the data of rows 0 to 7 in the pixel array, and the pixel unit connected to the first group of transmission control lines in the 8 rows of data obtains half of the phase information; And at the same time, the right side of the vertical dividing line represents reading the data of rows 8 to 15 in the pixel array, and the pixel unit connected to the first group of transmission control lines in the 8 rows of data obtains the other half of the phase information; therefore, the completed phase information can be obtained based on the pixel units connected to the first group of transmission control lines in rows 0 to 15. Therefore, under the control of the timing signal as shown in FIG. 9, the present application can realize a phase focus mode in which the density of the left and right phase information is 6%. It should be noted that it can be understood that in this mode, a pixel unit connected to the first group of transmission control lines is only used to obtain half of the phase information. Therefore, for the total pixel unit used to acquire phase focus information, it can be understood that the density of the acquired focus information data is reduced by half. Of course, it can also be other density transformations designed by those skilled in the art according to actual requirements.

In other embodiments, the timings of the first transmission control line txap and the second transmission control line txbp in the first group of transmission control lines txap, txbp, txcp, and txdp may be set to be the same, and the timing of the third transmission control line txbp and the fourth transmission control line txdp are set to be the same, so as to achieve a phase focus mode in which the density of the up and down phase information is 6%.

The Second Embodiment

Figure 10:
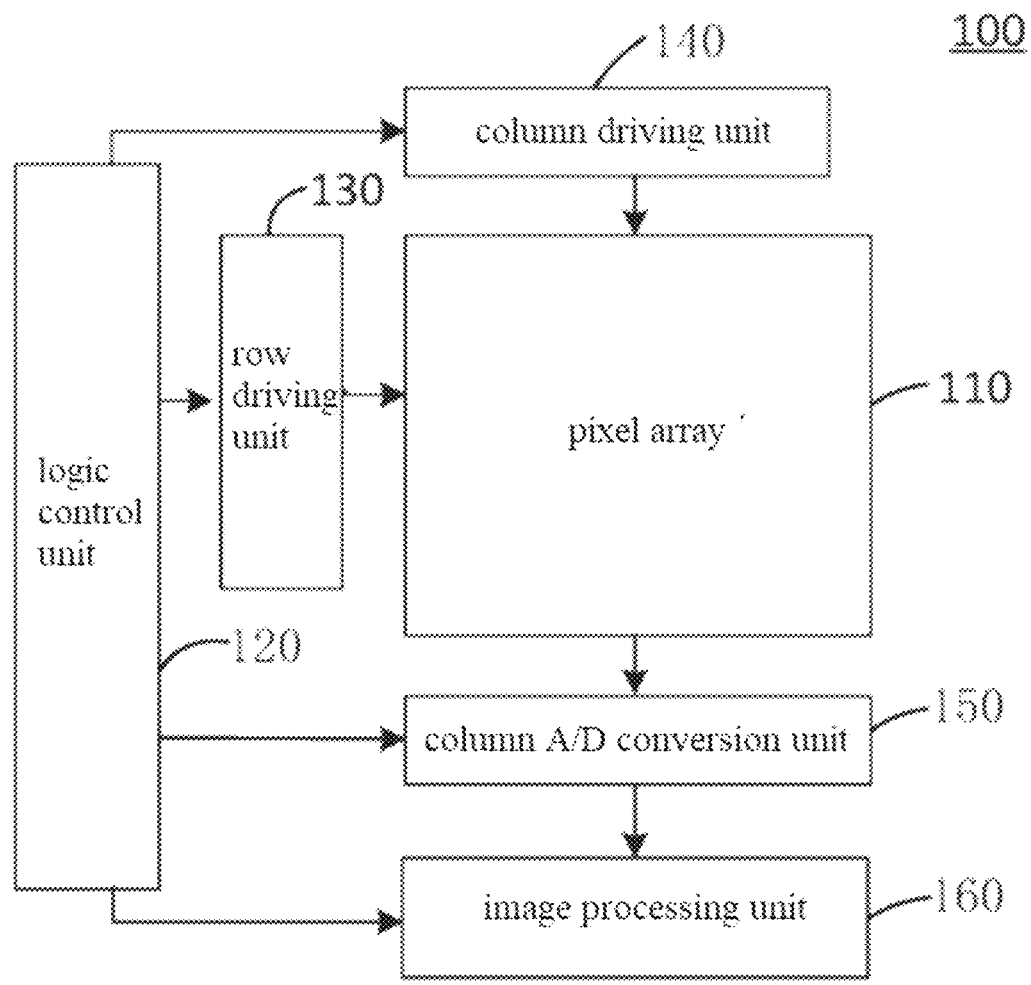
FIG. 10 is an image sensor according to an embodiment of this application.

Referring to FIG. 10, as shown in FIG. 10, the present embodiment provides an image sensor 100, including a pixel array 110. The pixel array 110 is arranged in rows and columns, and the structure of each pixel in the pixel array 110 may be the pixel structure as shown in FIG. 2 and FIG. 3. Please refer to the above description for the specific situation of the pixel structure, which will not be repeated here.

In addition, as an illustrative embodiment, the image sensor further includes a logic control unit 120, a driving unit, a column A/D conversion unit 150, and an image processing unit 160; among them:

the logic control unit 120 is configured to control the working timing logic of the entire system;

one end of the driving unit is connected to the logic control unit 120, and the other end is coupled to the pixel array 110 for driving and controlling each control signal line in the pixel array 110. Specifically, the driving unit includes a row driving unit 130 and a column driving unit 140. One end of the row driving unit 130 is connected to the logic control unit 120, and the other end is coupled to the pixel array 110 for providing the pixel array 110 with corresponding row control signals. One end of the column driving unit 140 is connected to the logic control unit 120, and the other end is coupled to the pixel array 110 for providing corresponding column control signals to the pixel array 110.

the column A/D conversion unit 150 corresponds to each column of pixels in the pixel array 110, and is configured to implement analog/digital conversion of column signals under the control of the logic control unit 120;

The image processing unit 160 is configured to perform image processing on the image digital signal output by the column A/D conversion unit 150 under the control of the logic control unit 120.

The Third Embodiment

The present embodiment provides a control method for the above pixel circuit, and the control method includes: acquiring image information based on the first group of transmission control lines and the second group of transmission control lines, wherein the first group of transmission control lines may be used as a second group of transmission control lines. In an optional embodiment, the control timing of the first group of transmission control lines is the same as the control timing of the second group of transmission control lines, and the correspondence between the first group of transmission control lines and the pixel units and the correspondence between the second group of transmission control lines and the pixel units are consistent, and the two may achieve the acquisition of traditional image information through corresponding timing control.

In addition, acquiring the phase focus information based on the first group of transmission control lines and the second group of transmission control lines, that is, both are used to obtain focus information to achieve 100% phase focus. To obtain all phase focus information based on the first group of transmission control lines and the second group of transmission control lines, please refer to the above description, and will not be repeated here.

In addition, the solution of the present invention can also obtain phase focus information based on the first group of transmission control lines, and obtain image information based on the second group of transmission control lines, so as to implement partial phase focus. To obtain partial phase focus information based on the first group of transmission control lines and the second group of transmission control lines, please refer to the above description, and will not be repeated here.

In this embodiment, the control method includes a single-row reading mode or a parallel reading mode, wherein in a reading process, by controlling the timing of the first group of transmission control lines and the second group of transmission control lines, the phase focus information may be obtained based on different pixels of the same pixel unit connected to the first transmission control line, or the phase focus information may be acquired based on the pixel units connected to the first transmission control line in different pixel unit rows.

Specifically, for the method of acquiring phase focus information based on different pixels in the same pixel unit connected to the first transmission control line, that is, in this manner, in the pixel array, each pixel unit connected to the first group of transmission control lines can independently obtain complete phase focus data. It can be considered that the density of the phase focus data is the density of the pixel units connected to the first group of transmission control lines.

In addition, for the method of acquiring phase focus information based on the pixel units connected to the first transmission control line in different pixel unit rows, it can be understood that, in the pixel array, each pixel unit connected to the first group of transmission control lines is used to obtain partial phase focus data, and at least two different pixel units can obtain complete phase focus data. At this time, it can be considered that the density of phase focus data is less than the density of the pixel units connected to the first group of transmission controls.

In this embodiment, the method of acquiring phase focusing information based on different pixel unit rows includes: the pixel array includes a first focus pixel row having at least one first pixel unit connected to the first transmission control line, and a second focus pixel row having at least one second pixel unit connected to the first transmission control line, wherein, acquiring first focus information based on the first focus pixel row, and acquiring second focus information based on the second focusing pixel row, so as to obtain the phase focus information.

Specifically, for example, the first focus information acquired by the first focus pixel row may be left and right phase information, and the second focus information acquired by the second focus pixel row may be up and down phase information.

Obviously, those skilled in the art can make various changes and modifications to the invention without departing from the spirit and scope of the application. In this way, if these modifications and variations of this application fall within the scope of the claims of this application and their equivalent technologies, this application also intends to include these modifications and variations. The technical features of the above-mentioned embodiments can be combined arbitrarily. In order to make the description concise, all possible combinations of the various technical features in the above-mentioned embodiments are not described, however, as long as there is no contradiction in the combination of these technical features, all should be considered as the scope of this specification.

It should be noted that in this article, the terms "including", "including" or any other variants thereof are intended to cover non-exclusive inclusion, so that a process, method, article or device including a series of elements not only includes those elements, it also includes other elements that are not explicitly listed, or elements inherent to the process, method, article, or device. Without more restrictions, the element defined by the sentence "including a . . . " does not exclude the existence of other identical elements in the process, method, article, or device that includes the element. In addition, different implementations of this application, the parts, features, and elements with the same name in the examples may have the same meaning or different meanings, and their specific meanings need to be determined by their interpretation in the specific embodiment or further combined with the context in the specific embodiment.

It should be understood that although the terms first, second, third, etc. may be used herein to describe various elements, these elements should not be limited to these terms. These terms are only used to distinguish the same type of information from each other. For example, without departing from the scope of this document, the first element may also be referred to as the second element, and similarly, the second element may also be referred to as the first element. Depending on the context, as used in this article, the singular forms "a", "an" and "the" are intended to also include the plural form, unless the context dictates to the contrary. It should be further understood that the terms "comprising" and "including" indicate the presence of the described features, steps, operations, elements, components, items, types, and/or groups, but do not exclude one or more other features, steps, operations, The existence, appearance or addition of elements, components, items, categories, and/or groups. The terms "or" and "and/or" used herein are interpreted as inclusive or mean any one or any combination. Therefore, "A, B or C" or "A, B and/or C" means "any of the following: A; B; C; A and B; A and C; B and C; A, B and C". An exception to this definition will only occur when the combination of elements, functions, steps, or operations is inherently mutually exclusive in some way.

The above are embodiments of the present application only, and should not be deemed as limitations to the scope of the present application. It should be noted that similar variations will become apparent to those skilled in the art to which the present application pertains. Therefore, the scope of the present application is defined by the appended claims.

What is claimed is:

1. A pixel circuit, wherein the pixel circuit comprises a plurality of pixel units arranged in an array, each pixel unit comprises:
at least two pixels, each of the pixels comprises a photoelectric conversion element and a transmission transistor, and the photoelectric conversion element is used for generating an electric charge in response to incident light; the transmission transistor is coupled between the photoelectric conversion element and a floating diffusion node, and is configured to transfer the electric charge accumulated by the photoelectric conversion element in an exposure process to the floating diffusion node according to a transmission control signal;
wherein, the transmission transistor of at least one of the pixels of at least one of the pixel units is connected to a corresponding first group of transmission control lines, and the transmission transistors of other pixel units are connected to a corresponding second group of transmission control lines;
wherein when a density of phase focus is 100%, a timing of a transmission control signal received by the first group of transmission control lines is the same as a timing of the transmission control signal received by the second group of transmission control lines; and when the density of phase focus is not 100%, the timing of the transmission control signal received by the first group of transmission control lines is different from the timing of the transmission control signal received by the second group of transmission control lines.

2. The pixel circuit of claim 1, wherein at least two of the pixels in the same pixel unit share a micro lens, and at least two of the pixels sharing the same micro lens are connected to a corresponding first group of transmission control lines.

3. The pixel circuit of claim 1, wherein all of the pixels in the same pixel unit share a micro lens.

4. The pixel circuit of claim 1, wherein the number of transmission control lines of the first group of transmission control lines is less than or equal to the number of pixels of a pixel unit connected to the first group of transmission control lines.

5. The pixel circuit of claim 1, wherein the number of the transmission control lines of the first group of transmission control lines is greater than the number of pixels of a pixel unit connected to the first group of transmission control lines.

6. The pixel circuit of claim 1, wherein each row of the pixel units is provided with the corresponding first group of transmission control lines and the corresponding second group of transmission control lines.

7. The pixel circuit of claim 1, wherein the pixel units of a nth row of the pixel circuit are arranged in cycles corresponding to a first green color filter and a blue color filter, and the pixel units of a (n+1)th row are arranged in cycles corresponding to a red filter and a second green color filter; or, each pixel unit group comprises four pixel units arranged in an array, and the four pixel units of each pixel unit group respectively correspond to the first green color filter, the blue color filter, the second green color filter and the red color filter in a clockwise direction; wherein, the pixel unit connected to the first group of transmission control lines is correspondingly arranged at a position corresponding to the first green color filter.

8. The pixel circuit of claim 1, wherein in the same row of pixel units, two of the pixel units connected to the first group of transmission control lines are separated by at least one pixel unit.

9. The pixel circuit of claim 1, wherein the pixel circuit further comprises:
- a reset transistor, which is coupled between a first voltage source and the floating diffusion node; and/or,
- an amplification output unit, which is coupled to the floating diffusion node and is configured to output a voltage signal of the floating diffusion node; and/or,
- a dual-conversion gain control unit, which is coupled between the reset transistor and the floating diffusion node and is configured to implement gain control; and/or,
- a row selection transistor, which is coupled between an output terminal of the amplification output unit and a column output line, and a gate of the row select transistor receives a row selection control signal for outputting the voltage signal of the floating diffusion node.

10. The pixel circuit of claim 1, wherein each of the pixel units comprises four of the pixels, and four of the pixels of the same pixel unit share one micro lens, and the first group of transmission control lines comprises four transmission control lines;
wherein, the transmission transistors of the four pixels of the pixel unit connected to the first group of transmission control lines are respectively connected to the four transmission control lines of the corresponding first group of transmission control lines.

11. The pixel circuit of claim 2, wherein each of the pixel units comprises four of the pixels, and four of the pixels of the same pixel unit share one micro lens, and the first group of transmission control lines comprises four transmission control lines;
wherein, the transmission transistors of the four pixels of the pixel units connected to the first group of transmission control lines are respectively connected to the four transmission control lines of the corresponding first group of transmission control lines.

12. The pixel circuit of claim 7, wherein each of the pixel units comprises four of the pixels, and four of the pixels of the same pixel unit share one micro lens, and the first group of transmission control lines comprises four transmission control lines;
wherein, the transmission transistors of the four pixels of the pixel units connected to the first group of transmission control lines are respectively connected to the four transmission control lines of the corresponding first group of transmission control lines.

13. The pixel circuit of claim 10, the second group of transmission control lines comprises four transmission control lines, wherein when the phase focus density is not 100%, a time when the first sub-transmission control line of the first group of transmission control lines receives an effective-level transmission control signal and the time when the second sub transmission control line of the first group of transmission control lines receives the effective-level transmission control signal are offset from each other to obtain left-right phase information and/or up-down phase information, and four transmission control lines of the second group of transmission control lines receive the effective-level transmission control signal to obtain image information;
wherein, the first sub-transmission control line comprises two transmission control lines correspondingly connected to a first pair of pixels adjacent to each other in the four pixels, and the second sub-transmission control line comprises two transmission control lines correspondingly connected to a second pair of pixels other than the first pair of pixels in the four pixels.

14. The pixel circuit of claim 11, the second group of transmission control lines comprises four transmission control lines, wherein when the phase focus density is not 100%, a time when the first sub-transmission control line of the first group of transmission control lines receives an effective-level transmission control signal and the time when the second sub transmission control line of the first group of transmission control lines receives the effective-level transmission control signal are offset from each other to obtain left-right phase information and/or up-down phase information, and four transmission control lines of the second group of transmission control lines receive the effective-level transmission control signal to obtain image information;
wherein, the first sub-transmission control line comprises two transmission control lines correspondingly connected to a first pair of pixels adjacent to each other in the four pixels, and the second sub-transmission control line comprises two transmission control lines correspondingly connected to a second pair of pixels other than the first pair of pixels in the four pixels.

15. The pixel circuit of claim 12, the second group of transmission control lines comprises four transmission control lines, wherein when the phase focus density is not 100%, a time when the first sub-transmission control line of the first group of transmission control lines receives an effective-level transmission control signal and the time when the second sub transmission control line of the first group of transmission control lines receives the effective-level transmission control signal are offset from each other to obtain left-right phase information and/or up-down phase information, and four transmission control lines of the second group of transmission control lines receive the effective-level transmission control signal to obtain image information;
wherein, the first sub-transmission control line comprises two transmission control lines correspondingly connected to a first pair of pixels adjacent to each other in the four pixels, and the second sub-transmission control line comprises two transmission control lines correspondingly connected to a second pair of pixels other than the first pair of pixels in the four pixels.

16. An image sensor, comprising the pixel circuit of claim 1.

17. A control method of the pixel circuit of claim 1, wherein the control method comprises:
- acquiring image information based on the first group of transmission control lines and the second group of transmission control lines; or acquiring phase focus information based on the first group of transmission control lines and the second group of transmission control lines; or acquiring phase focus information based on the first group of transmission control lines, and acquiring image information based on the second group of transmission control lines.

18. The control method of the pixel circuit of claim 17, wherein the control method comprises a single-row reading mode or a parallel reading mode, wherein:

acquiring the phase focus information based on different pixels of a same pixel unit connected to the first group of transmission control lines in a reading process; or acquiring the phase focus information based on the pixel units of different pixel unit rows connected to the first group of transmission control lines in the reading process.

19. The control method of the pixel circuit of claim 18, wherein the manner of acquiring the phase focus information based on different pixel unit rows comprises:

a pixel array has a first focus pixel row comprises at least one first pixel unit connected to the first group of transmission control lines, and a second focus pixel row comprises at least one second pixel unit connected to the first group of transmission control lines, wherein acquiring first focus information based on the first focus pixel row, and acquiring second focus information based on the second focusing pixel row, so as to obtain the phase focus information.

* * * * *